United States Patent [19]

Rozman

[11] Patent Number: 5,177,745
[45] Date of Patent: Jan. 5, 1993

[54] MEMORY DEVICE WITH A TEST MODE

[75] Inventor: Rodney R. Rozman, Placerville, Calif.

[73] Assignee: Intel Corporation, Santa Clara, Calif.

[21] Appl. No.: 589,391

[22] Filed: Sep. 26, 1990

[51] Int. Cl.⁵ .......................................... G01R 31/28
[52] U.S. Cl. ................................. 371/21.1; 371/15.1; 365/201
[58] Field of Search ........................... 371/21.1, 15.1; 365/201

[56] References Cited

U.S. PATENT DOCUMENTS

| 4,811,299 | 3/1989 | Miyazawa et al. | 365/201 |
| 4,951,254 | 8/1990 | Ontrop et al. | 365/201 |
| 5,051,995 | 9/1991 | Tobita | 371/21.1 |
| 5,072,137 | 12/1991 | Slemmer | 371/21.1 |
| 5,077,738 | 12/1991 | Larsen et al. | 371/15.1 |

OTHER PUBLICATIONS

*Intel Corporation 1989 Memory Components Handbook*, pp. 4-77 to 4-87 (Oct. 1988).

Primary Examiner—Charles E. Atkinson
Attorney, Agent, or Firm—Blakely, Sokoloff, Taylor & Zafman

[57] ABSTRACT

A memory device is described. The memory device includes a memory array. An address buffer is provided for storing a plurality of bits of an address for addressing the memory array. The address is applied as an input of the address buffer. Each bit of the address can be in a first voltage state, a second voltage state, and a third voltage state. When at least one bit of the plurality of bits of the address is in the third voltage state, a test mode for the memory device is initiated. Circuitry is also provided for allowing the entire memory array to be addressed. The circuitry detects the state of two bits of the address and converts two corresponding address bits stored in the address buffer to the first voltage state if the two bits of the address are in the third voltage state. The circuitry is coupled to the address buffer. A method of triggering a memory device is also described.

18 Claims, 4 Drawing Sheets

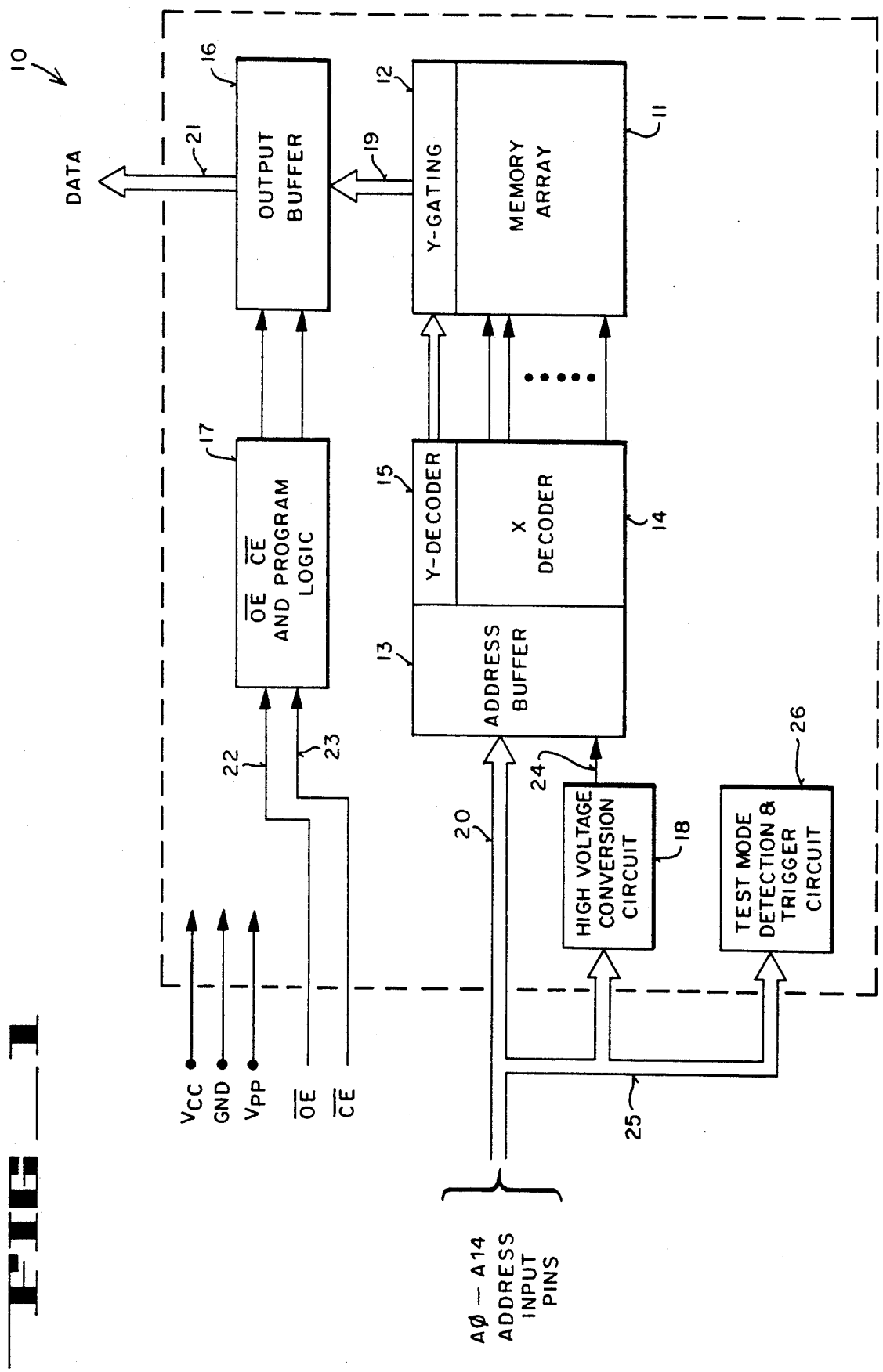
FIG—1

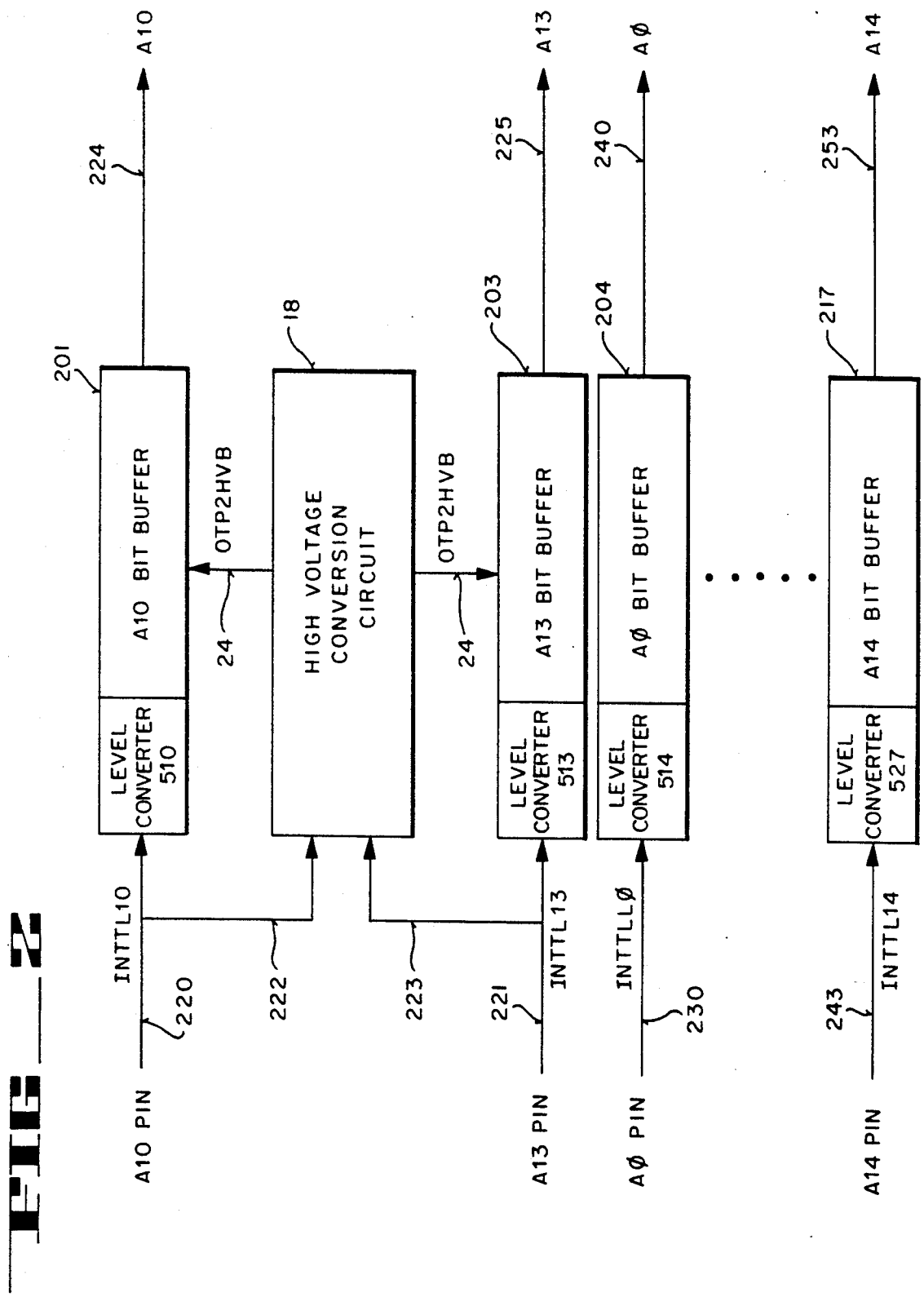
FIG_2

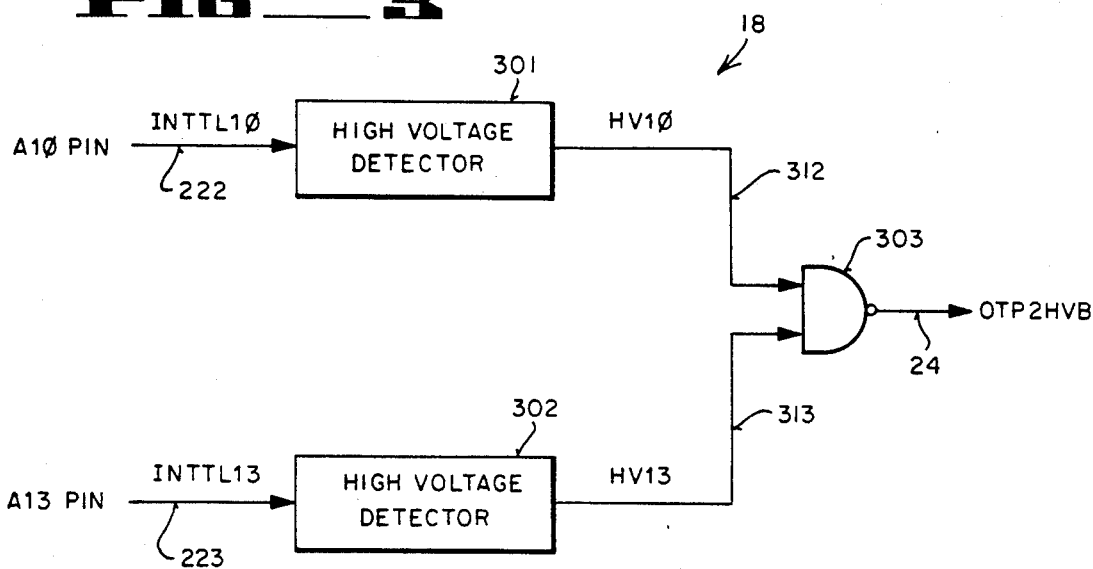
FIG_3
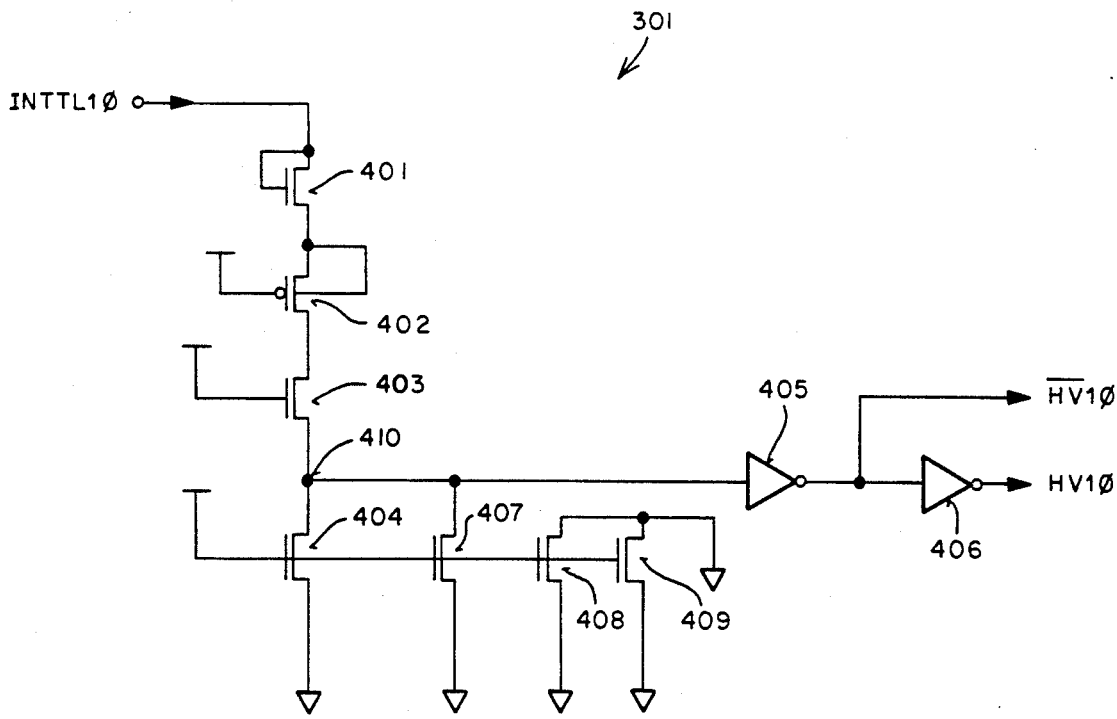
FIG_4

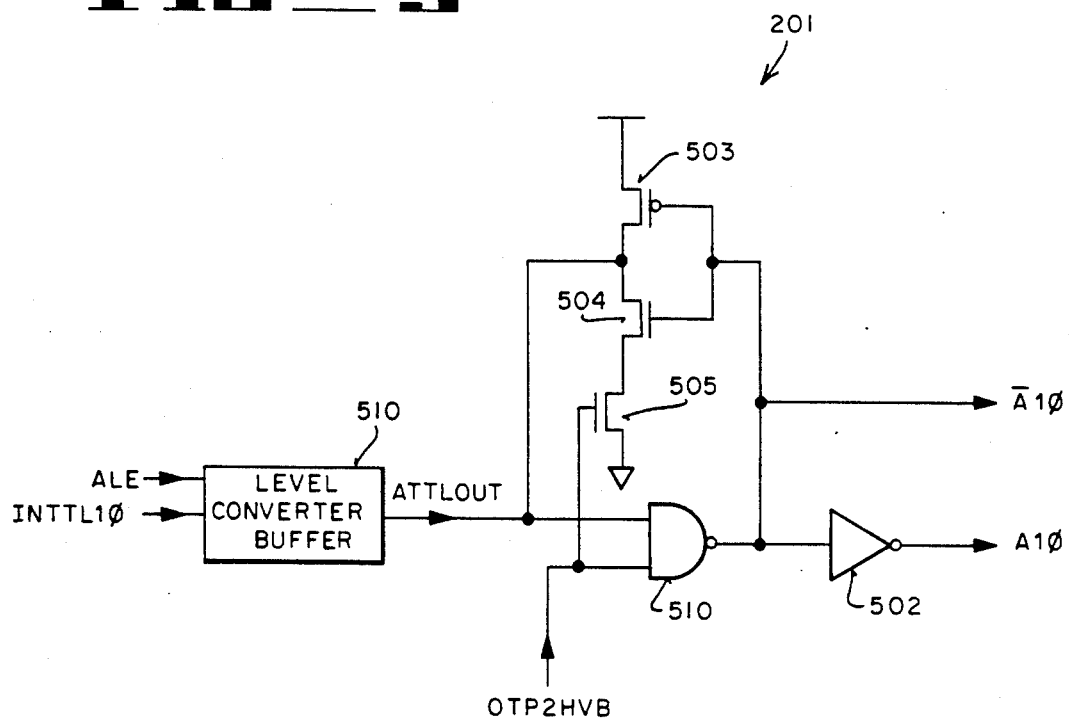
FIG_5
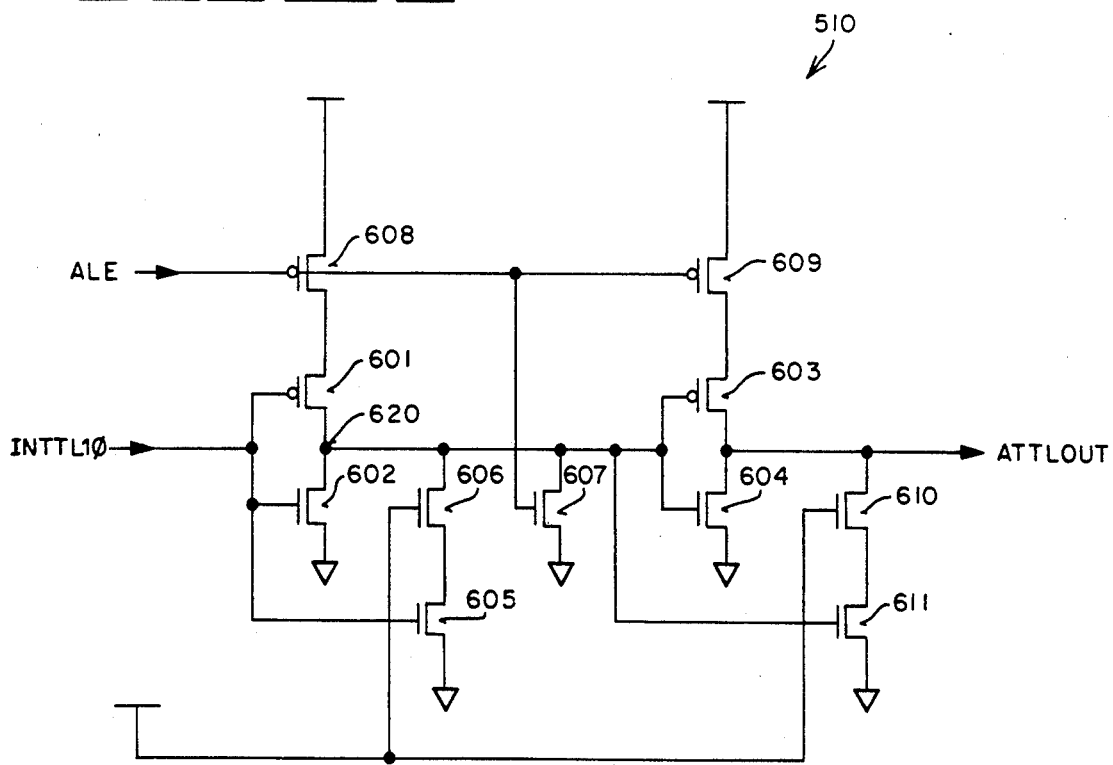
FIG_6

MEMORY DEVICE WITH A TEST MODE

FIELD OF THE INVENTION

The present invention pertains to the field of computer memories. More particularly, this invention relates to a memory device, wherein a memory array of the memory device is fully addressable in at least one test mode triggered by elevated voltages being applied to address pins of the memory device.

BACKGROUND OF THE INVENTION

One type of prior art non-volatile computer memory is the erasable programmable read-only memory ("EPROM"). The EPROM can be programmed by a user. Once programmed, the EPROM retains its data until erased. Erasure of an EPROM with ultraviolet light erases the entire contents of the memory. The memory may then be reprogrammed with new data.

One type of prior art EPROM is the 27C256 complementary high-performance metal oxide semiconductor ("CHMOS") EPROM manufactured by Intel Corporation of Santa Clara, Calif., which is 256 Kilobit (32 Kilobit by 8 bit) 5 volt EPROM. The 27C256 EPROM includes an address buffer to receive addresses from address input pins of the EPROM. Addresses stored in the address buffer are decoded in a decoding circuit to address the memory array of the device. The device also includes a chip enable pin $\overline{CE}$ and output enable pin $\overline{OE}$, which are the two control function pins.

That EPROM has a plurality of normal operating modes. Those normal operating modes include a read mode, a programming mode, and a standby mode. For the read mode, a logic low signal is applied to both the chip enable pin and the output enable pin. This permits data stored in the EPROM to be read out as addressed. Addresses are provided at the address pins to access the data stored in the memory array.

A programming mode allows data to be stored by the EPROM. To enter the programming mode, a logical high signal is applied to the output enable $\overline{OE}$ pin, a logical low signal is applied to the chip enable $\overline{CE}$ pin and a 12 volt high voltage is applied to a Vpp pin of the EPROM. Once in the programming mode, then data applied to the EPROM is stored in memory cells of the EPROM at addresses provided from the address input pins.

A standby mode is entered by applying a logical high voltage at the chip enable pin $\overline{CE}$ of the device. Power consumption of the EPROM is substantially reduced in the standby mode.

When the EPROM operates in one of the normal operating modes, the address input pins receive addresses that are only used to address data. Each of the addresses includes a set of binary bits. Each bit is either a logical zero or a logical one.

Before certain prior art EPROMs are shipped by at least one manufacturer, a series of tests are conducted to determine whether the EPROMs meet product specifications. Some tests relate to individual cells in the memory array. For one such test, a high voltage is applied over the oxide layer of a cell to stress the cell in order to detect whether the layer breaks down under such high voltage. Another is to apply a significantly high voltage to the gate or drain of a cell to detect whether the content of the cell, when programmed, is erased under such high voltage. The EPROMs not meeting the specifications are rejected.

In order to facilitate the tests, certain prior art EPROMs include a set of test modes. Each test mode is designated for at least one test operation. The various functions of the device are tested by the test modes. Some of the test modes test the internal configuration of the EPROM.

One category of prior art EPROM typically has about 25 to 100 test modes. A logical high voltage for the input pins of that EPROM is approximately 2 volts, and a logical low voltage for the input pins of that EPROM is approximately 0.8 volts. A certain desired test mode is triggered in one type of the prior art EPROM device by applying a high voltage of approximately 12 volts to a certain one of the address input pins. The applied high voltage of 12 volts is then received by a test mode detection and trigger circuit and the desired test mode is triggered by the circuit. The applied high voltage of 12 volts remains on the particular address input pin to maintain the test mode. The high voltage of 12 volts is significantly higher than the logical high voltage of 2 volts so that the test mode detection and trigger circuit with the EPROM can distinguish the high voltage from a logical high signal. If the high voltage of 12 volts is applied to a different address input pin of the EPROM, then a different test model is initiated. When an individual cell is tested, the address on the address pins of the EPROM is used to locate the particular cell.

An end user of certain prior art EPROM is typically unaware of the test modes of the EPROM. Those test modes are typically not referenced by the data sheets that the end user sees. In addition, normal operation of the EPROM typically does not require that the end user use the test modes. In particular, an end user typically would have no occasion to apply a high voltage of 12 volts to any of the address pins of the EPROM. Therefore, it is typically stated that the test modes of the EPROM are transparent to the end user.

One disadvantage of the prior art way of using single address pins to trigger test modes is that the address pin to which the high voltage of 12 volts is applied to trigger the test mode cannot simultaneously be used for the purpose of addressing a data location. In other words, that pin used for triggering the test mode loses its "addressing" function during the test mode. Thus, not all memory locations are addressable during the test mode that uses the an address pin to trigger the test mode. Nevertheless, it would be advantageous for certain tests that the entire memory array be addressable during those tests.

SUMMARY AND OBJECTS OF THE INVENTION

One of the objects of the present invention is to provide circuitry and a method for addressing an entire array of a memory device during a test mode.

Another object of the present invention is to provide circuitry and a method for a test mode that is triggered by address pins yet allows the entire array of the memory device to be addressed during the test mode.

Another object of the present invention is to provide circuitry and a method for addressing an entire array of a memory device during a test mode without adding pins to the memory device.

A memory device is described. The memory device includes a memory array. An address buffer is provided for storing a plurality of bits of an address for addressing the memory array. The address is applied as an input of the address buffer. Each bit of the address can be in a first voltage state, a second voltage state, and a third voltage state. When at least one bit of the plurality of bits of the address is in the third voltage state, a test mode for the memory device is initiated. Circuitry is also provided for allowing the entire memory array to be addressed. The circuitry detects the state of two bits of the address and converts two corresponding address bits stored in the address buffer to the first voltage state if the two bits of the address are in the third voltage state. The circuitry is coupled to the address buffer.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 1 is a block diagram that shows an EPROM that includes a high voltage conversion circuit;

FIG. 2 is a block diagram of the high voltage conversion circuit and the address buffer;

FIG. 3 shows the circuitry of the high voltage conversion detection circuit of FIG. 2;

FIG. 4 is a circuit diagram of a high voltage detector circuit;

FIG. 5 is a circuit diagram of one address buffer;

FIG. 6 is a circuit diagram of a level converter buffer.

DETAILED DESCRIPTION

FIG. 1 is the block diagram of EPROM 10. EPROM 10 includes high voltage conversion circuitry 18, which is described in more detail below.

In FIG. 1, EPROM 10 includes memory array 11, which is made up of memory cells that store data at addresses. In one embodiment, memory array 11 can store 256K ("kilobits") of data. In alternative embodiments, memory array 11 can be larger or smaller than 256K. In one preferred embodiment, the circuitry of EPROM 10 employs CHMOS circuitry.

Vpp is the program power supply voltage for EPROM 10. Vcc is the chip power supply for EPROM 10 and GND is ground. In one embodiment, Vpp is approximately 12 volts and Vcc is approximately 5 volts. In that embodiment, the input logical high voltage is 2 volts and the input logical low voltage is 0.8 volts.

In one embodiment, EPROM 10 includes 15 address input pins A0 through A14 for applying addresses to EPROM 10 for accessing memory array 11. Address input pins A0 through A14 are coupled to address buffer 13. Address buffer 13 includes fifteen bit buffers (not shown), each of which receives and stores one bit of an address applied at one of the address input pins A0 pin to A14 pin.

In one alternative embodiment, EPROM 10 has fewer than 15 address input pins. In another alternative embodiment, EPROM 10 has more than 15 address input pins.

EPROM 10 includes chip enable pin $\overline{CE}$ and output enable pin $\overline{OE}$. Chip enable pin $\overline{CE}$ is a power enable pin and is used for device selection. Output enable pin $\overline{OE}$ is an output enable pin and is used to gate data to the output pins of EPROM 10 independent of device selection. Both of the control pins $\overline{CE}$ and $\overline{OE}$ must be logically low in order to obtain data at the outputs of EPROM 10. Both chip enable pin $\overline{CE}$ and output enable pin $\overline{OE}$ are connected, via lines 22 and 23 respectively, to control and program logic 17. When the chip enable pin $\overline{CE}$ is high at the Vcc voltage, EPROM 10 enters a standby mode. In the standby mode, power consumption by EPROM 10 is substantially reduced.

In the absence of a 12 volt Vpp being applied to EPROM 10, EPROM 10 acts as a read only memory ("ROM"). Addresses are sent from address input pins A0 through A14 pin to address buffer 13 via address bus 20. The addresses are then sent from address buffer 13 to an X decoder 14 and a Y decoder 15. X decoder 14 is the row decoder for memory array 11 and Y decoder 15 is the column decoder for memory array 11. The data stored in the cells of memory array 11 as addressed is read out via bus 19 to output buffer 16. The data is then made available to the external circuitry via data bus 21.

EPROM 10 has a plurality of operating modes. A read mode is initiated when both chip enable pin $\overline{CE}$ and output enable pin $\overline{OE}$ are set to logical low state. When EPROM 10 is in the read mode, data stored in memory array 11 can be read. A programming mode is initiated when a 12 volt Vpp is applied to EPROM 10. When EPROM 10 is in the programming mode, data can be stored in memory array 11. EPROM 10 enters into a standby mode when a Vcc voltage is applied to chip enable pin $\overline{CE}$. As described above, when EPROM 10 is in the standby mode, the power consumption of EPROM 10 is substantially reduced.

EPROM 10 is also equipped with approximately 100 test modes that are transparent to users. These test modes are used to check whether EPROM 10 meets with its product specifications. A desired test mode is entered by applying a test mode enabling signal through one or more than one of the address input pins A0 through A14 of EPROM 10.

EPROM 10 enters into a test mode by placing a high voltage $V_h$ on any one of the address input pins A0 through A14, including address input pin A10 or address input pin A13. In one embodiment, the high voltage $V_h$ is equal to approximately 12 volts, which is approximately equal to the Vpp voltage.

In a preferred embodiment, EPROM 10 also enters a particular test mode if the high voltage $V_h$ is alternatively or simultaneously applied to the two pins A10 and A13 of the address input pins.

In one alternative embodiment, EPROM 10 enters a test mode if the high voltage $V_h$ is simultaneously applied to any two pins of address input pins A0 through A14. In another alternative embodiment, EPROM 10 enters a test mode if the high voltage $V_h$ is simultaneously applied to three or more pins of address input pins A0 through A14.

A desired test mode for EPROM 10 of FIG. 1 is detected and initiated by a test mode detection and trigger circuit 26. Test mode detection and trigger circuit 26 receives its input from address input pins A0 through A14 via address bus 25. Test mode detection and trigger circuit 26 first detects (via address bus 25) the appearance of the high voltage $V_h$ applied on any of address input pins A0 through A14. If the high voltage $V_h$ is detected on at least one pin of address input pins A0 through A14, test mode detection and trigger circuit 26 causes EPROM 10 to enter the desired test mode. For example, if the high voltage $V_h$ of 12 volts is on pins A10 and A13, then a test mode is initiated. As a further example, if the high voltage $V_h$ is on A2 pin alone, then a test mode is also triggered.

As shown in FIG. 1, EPROM 10 includes high voltage conversion circuit 18. High voltage conversion circuit 18 is connected via line 24 to address buffer 13. High voltage conversion circuit 18 receives its input via bus 25 from the address input pins A0 through A14. The function of high voltage conversion circuit 18 is to detect high voltage $V_h$ applied on the two address input pins A10 and A13 and convert the high voltage $V_h$ applied on the two address input pins A10 and A13 into two bits of logical low (i.e., logical zero) voltage address information to be stored. The circuitry of high voltage conversion circuit 18 and its interaction with address buffer 13 is described in more detail below.

When an address is applied to address input pins of EPROM 10 and, at the same time, a high voltage $V_h$ is applied to one of the address input pins, address buffer 13 (1) converts that single high voltage $V_h$ to a logical high voltage and (2) provides as an output the rest of the address pins in either a logical high or a logical low state. If, however, a high voltage $V_h$ is applied simultaneously to address input pins A10 and A13, then high voltage conversion circuit 18 forces the bits of address buffer 13 that correspond to pins A10 and A13 into the logical zero state. By doing so, high voltage conversion circuit 18 allows the entire memory array 11 to be addressable in the test mode. The process is described in more detail below.

Although in one preferred embodiment pins A10 and A13 are used to initiate a test mode, in alternative embodiments any two address input pins can be used to initiate a test mode in which the entire memory array 11 can be addressed.

In yet another alternative embodiment, three or more address input pins can be used to trigger or initiate mode for EPROM 10 in which the entire memory array 11 is addressable.

During normal operation when EPROM 10 is not to be placed in a test mode, the high voltage $V_h$ is not applied to the address input pins of EPROM 10. An address is sent from address input pins A0 pin through A14 pin to address buffer 13 via bus 20 and to high voltage conversion circuit 18 via bus 25. Given that during normal operation no high voltage $V_h$ is applied to any one of address input pins A0 pin through A14, high voltage conversion circuit 18 is not activated during normal operation. The address stored in address buffer 13 is used to access memory array 11 through X decoder 14 and Y decoder 15.

A particular test mode is enabled in EPROM 10 by applying the high voltage $V_h$ (1) on one of address input pins A0 through A14 or (2) on both pins A10 and A13 simultaneously. The high voltage $V_h$ is then fed to test mode detection and trigger circuit 26 to initiate the particular test mode.

During the test mode, addresses are supplied to the address buffer 13. One or two of the address input pins, however, are constantly supplied with high voltage $V_h$ during a test mode. Address buffer 13 functions to convert a single received high voltage $V_h$ to a logic high (i.e., logical one) signal. For example, if the high voltage $V_h$ appears on address input pin A2, address buffer 13 converts the $V_h$ voltage to logical high voltage. On the other hand, if only address input pin A13 is supplied with the high voltage $V_h$, address buffer 13 converts the $V_h$ voltage to a logical high voltage.

High voltage conversion circuit 18 is coupled to both address input pins A10 and A13. When the high voltage $V_h$ is applied to either A10 pin or A13 pin, but not to both simultaneously, then high voltage conversion circuit 18 is not activated. That means that high voltage conversion circuit 18 maintains its output to address buffer 13 logically high, which indicates that high voltage conversion circuit 18 is inactive. When the high voltage $V_h$ is applied to both the A10 pin and A13 pin simultaneously, however, then high voltage conversion circuit 18 is activated and generates a logical low signal on line 24, which indicates that high voltage conversion circuit 18 is active. This causes address buffer 13 to force the two bits corresponding to bits A10 and A13 into the logical low state.

If, for example, a high voltage $V_h$ is applied to address input pin A10 alone, then test mode detection and trigger circuit 26 causes EPROM 10 to enter the test mode. Meanwhile, addresses are supplied to address buffer 13 through the use of the remaining address input pins A0 through A9 and A11 through A14. Address buffer 13 converts the high voltage $V_h$ signal on the A10 pin to a logical high (i.e., logical one) value. High voltage conversion circuit 18 does not respond to the high voltage $V_h$ from A10 pin alone. The output of high voltage conversion circuit 18 remains logically high.

If the high voltage $V_h$ is applied to address input A13 pin alone, test mode detection and trigger circuit 26 causes EPROM 10 to enter the test mode. Meanwhile, addresses appearing on address input pin A14 and address input pins A0 through A12 are supplied address buffer 13. Address buffer 13 also converts a high voltage $V_h$ signal from pin A13 to a logical high signal. Again, high voltage conversion circuit 18 does not respond.

When both A10 pin and A13 pin are simultaneously connected to the high voltage $V_h$, the test mode is also initiated by test mode detection and trigger circuit 26. Address buffer 13 receives the signals appearing on address pins A0 through A9, pins A11 and A12, and pin A14. Address buffer 13 converts the high voltage $V_h$ signals received from pins A10 and A13 to logical high signals. At substantially the same time, high voltage conversion circuit 18 responds to the high voltage $V_h$ signal from the A10 pin and the A13 pin by forcing bit buffers of address buffer 13 corresponding to bits A10 and A13 into the logical low state. Under the control of this signal from high voltage conversion circuit 18, address buffer 13 outputs each of the two bits A10 and A13 as logical zero.

FIG. 2 illustrates the interconnections between address buffer 13 and high voltage conversion circuit 18. In FIG. 2, A10 bit buffer 201 and A13 bit buffer 203 are two bit buffers of address buffer 13. A10 bit buffer 201 is connected to A10 pin via line 220. A13 bit buffer 203 is connected to A13 pin via line 221. A10 bit buffer 201 outputs the A10 bit of an address through line 224. A13 bit buffer 203 outputs the A13 bit of an address through line 225. High voltage conversion circuit 18 directs its output OTP2HVB to A10 bit buffer 201 and A13 bit buffer 203 on line 24, respectively. A0 bit buffer 204 through A14 bit buffer 217 without the A10 and A13 bit buffers constitute the remaining 13 bit buffers of address buffer 13, and are coupled to the respective address input pins. The bit buffers corresponding to pins A0 through A9, pins A11 and A12, and pin A14 are not connected to high voltage conversion circuit 18.

An INTTL 10 signal is sent through A10 pin via line 220 to A10 bit buffer 201. The INTTL10 signal is either a logical zero, a logical one or a high voltage $V_h$ signal. An INTTL 13 signal is sent through A13 pin to A13 bit buffer 203 via line 221. The INTTL13 signal is either a logical zero, a logical one, or a high voltage $V_h$ signal. Both INTTL10 and INTTL13 signals are also made available to high voltage conversion circuit 18 through lines 222 and 223. Signals INTTL0 through INTTL9, and INTTL11, INTTL12, and INTTL 14 are the respective address input signals for bit buffers A0 through A9 and bit buffers A11, A12, and A14, respectively. A logical low signal, a logical high signal, or a high voltage $V_h$ signal can appear on each of INTTL0 through INTTL9, and INTTL11, INTTL12, and INTTL14.

High voltage conversion circuit 18 is designed to output an OTP2HVB signal to both A10 bit buffer 201 and A13 bit buffer 203 via line 24 only when both INTTL10 and INTTL13 signals are simultaneously of the high voltage $V_h$. Under the OTP2HVB signal, both A10 bit buffer 201 and A13 bit buffer 203 are forced to alter their bit content to logical zero and output the same on their outputs A10 and A13. When, however, either the A10 pin or A13 pin (but not both) is connected to the high voltage $V_h$, only one of the INTTL10 and INTTL13 signals is of the high voltage $V_h$. In that instance, high voltage conversion circuit 18 will not be triggered. High voltage conversion circuit 18 performs essentially an AND function over the high voltage $V_h$ on INTTL10 and INTTL13 signals. The OTP2HVB signal from high voltage conversion circuit 18 makes A10 bit buffer 201 and A13 bit buffer 203 output a logical zero signal when both INTTL10 and INTTL13 signals are of the high voltage $V_h$. The OTP2HVB signal stays on both A10 bit buffer 201 and A13 bit buffer 203 to force both of them to store and output a logical zero A10 and A13 signal until the high voltage $V_h$ disappears on either one or both of the A10 pin and A13 pin.

Table One below shows on the left side the possible states of address pins A10 and A13 of EPROM 10. Table One on the right side shows the corresponding states outputted by address buffer 13 for the A10 and A13 bits. The states outputted by address buffer 13 are internal to EPROM 10.

TABLE ONE

| Device Pin | | Internal Signal | |
|---|---|---|---|
| A10 pin | A13 pin | A10 | A13 |
| Vh | 0 | 1 | 0 |
| Vh | 1 | 1 | 1 |
| 0 | Vh | 0 | 1 |
| Vh | Vh | 0 | 0 |

$V_h$ in Table One represents the high voltage $V_h$ applied to A10 pin or A13 pin or both. As shown by Table One, $V_h$ on either A10 pin or A13 pin is regarded as and converted to a logical one input. But when a high voltage $V_h$ is simultaneously applied to both the A10 pin and the A13 pin, the high voltage conversion circuit 18 forces A10 bit buffer 201 and A13 bit buffer 203 to each output a logical zero signal.

Table One shows that the high voltage conversion circuit 18 allows bits A10 and A13 outputted by address buffer 13 to achieve the four possible combinatorial states—namely 00, 01, 10, and 11. This means that bits A10 and A13 can be used in conjunction with the rest of the address bits to address the entire memory array of EPROM.

If high voltage conversion circuit 18 were not part of EPROM 10, then one of the address bits A0 through A14 used to trigger the test mode would not be outputted by address buffer 13 as a logical zero. This would mean that the memory array would not be fully addressable, given that the trigger bit would in effect be "lost" because it could not achieve the logical zero state.

In contrast, the inclusion of high voltage conversion circuit 18 in EPROM 10 allows the memory array to be fully addressable during a test mode. High voltage conversion circuit 18 achieves this result without adding any additional pins to EPROM 10.

FIG. 3 illustrates in more detail a high voltage conversion circuit 18. In FIG. 3, high voltage conversion circuit 18 includes two identical high voltage detectors 301 and 302. High voltage detector 301 receives the INTTL10 signal from A10 pin via line 222. High voltage detector 302 receives the INTTL13 signal from A13 pin via line 223. A NAND gate 303 is also provided in high voltage conversion circuit 18 to provide the OTP2HVB signal. The inputs of the NAND gate 303 are connected to the output HV10 of high voltage detector 301 via line 312 and the output HV13 of high voltage detector 302 via line 313.

The INTTL10 signal is applied at A10 pin and received by high voltage detector 301 via line 222. The INTTL10 signal may be either an address bit signal or the high voltage $V_h$. High voltage detector 301 detects whether the incoming INTTL10 signal is comprised of the high voltage $V_h$. If so, high voltage detector 301 applies a logical high HV10 signal to NAND gate 303. If the INTTL10 signal does not include the high voltage $V_h$, high voltage detector 301 will not be triggered and its output signal HV10 remains at a logical low voltage. The INTTL13 signal from A13 pin is received by high voltage detector 302 via line 223. Like the INTTL10 signal, the INTTL13 signal may be either an address bit signal or the high voltage $V_h$. High voltage detector 302 performs the same function as high voltage detector 301 to detect whether the INTTL13 signal presents the high voltage $V_h$ to its input. When the INTTL13 signal turns to high voltage $V_h$, the high voltage $V_h$ is detected by high voltage detector 302. The HV13 output of high voltage detector 302 then goes to the logical high state. If no high voltage $V_h$ appears on A13 pin, the INTTL13 signal only includes a bit information of an address and high voltage detector 302 outputs a logical low voltage to NAND gate 303.

The two outputs HV10 from high voltage detector 301 and HV13 from high voltage detector 302 are sent to NAND gate 303.

When a high voltage $V_h$ is not applied to either pin A10 or A13, both inputs to NAND gate 303 are logically low, and NAND gate 303 outputs a logical high signal. If a high voltage $V_h$ is applied to either pin A10 or A13, but not to both simultaneously, the output of NAND gate 303 remains logically high. When, however, a high voltage $V_h$ is applied simultaneously to both pins A10 and A13, then NAND gate 303 outputs a logical low signal.

FIG. 4 shows the circuit diagram of high voltage detector 301 of FIG. 3. High voltage detector 302 of FIG. 3 has the same circuit diagram as that of high voltage detector 301.

High voltage detector 301 in FIG. 4 is designed to output a 5 volt HV10 signal when its INTTL10 input signal is at the high voltage $V_h$. Transistors 401, 402, 403 and 404 of high voltage detector 301 are connected in series, with the drain of transistor 401 connected to the INTTL10 input of high voltage detector 301. For high voltage detector 302, the INTTL10 signal is replaced by the INTTL13 signal.

At node 410, the drain of transistor 404 is connected by inverters 405 and 406 to the output HV10 of high voltage detector 301. Transistor 401 serves as a load transistor in the branch formed by transistors 401, 402, 403 and 404. The gates of transistors 402, 403 and 404 are all connected to power supply Vcc. Transistor 402 is a P channel transistor and transistors 403 and 404 are N channel transistors. An N channel transistor 407 is connected in parallel, at node 410, with N channel transistor 404. The gate of the N channel transistor 407 is connected to the power supply Vcc. The function of transistors 404 and 407 is to make sure the output HV10 of high voltage detector 301 has a zero volt output when outputting a low voltage signal. The input INTTL10 signals comprise (1) a 0.8 volts, which is a logical zero signal, (2) 2 volts, which is logical one signal, and (3) 12 volts which is the high voltage $V_h$.

When the INTTL10 input signal is at the high voltage $V_h$, transistors 402 and 403 are on ON condition. At this point, transistors 404 and 407 are weakly conducting, which pulls up the drain output of transistors of 404 and 407 to Vcc minus Vt voltage. Vt is the threshold voltage of transistors 404 and 407. Through inverters 405 and 406, a Vcc output is acquired at the output HV10 of high voltage detector 301. When the input INTTL10 of high voltage detector 301 is at either logical zero or logical one voltage. P channel transistor 402 is set at OFF condition by these voltages. Therefore, the output HV10 of high voltage detector 301 outputs a zero volt signal. The ON condition of transistors 404 and 407 at this time also makes sure that the output HV10 is at zero voltage.

FIG. 5 is a circuit diagram of bit buffer 201 of FIG. 2. In FIG. 5, bit buffer 201 includes a level converter buffer 510 at its input side. Level converter buffer 510 converts the incoming INTTL10 signal from TTL level to CMOS level. Level converter buffer 510 also converts the high voltage $V_h$ to a CMOS level logical high or logical one signal. Bit buffers 203-217 each includes a level converter. A NAND gate 501 is connected to the output ATTL OUT of level converter buffer 510, with its other input given by the OTP2HVB signal from high voltage conversion circuit 18 of FIG. 2. The output of NAND gate 501 is connected to the output A10 of bit buffer 201 by an inverter 502. The output of NAND gate 501 is fed back by CMOS transistors 503 and 504 to the input ATTL OUT of NAND gate 501.

As described above, the input INTTL10 signal can comprise a logical zero, a logical one, or a high voltage $V_h$ signal. The logical zero and one signals are of TTL level, which means at a minimum 0.8 volts for logical zero and 2 volts for logical one. The high voltage $V_h$ is 12 volts. The output ATTL OUT of level converter buffer 510 is at either 0 volts or approximately 5 volts, which is the power supply Vcc voltage. The high voltage $V_h$ is converted by level converter buffer 510 into a 5 volt output at the output ATTL OUT of level converter buffer 510. Controlled by the OTP2HVB signal from high voltage conversion circuit 18 in FIG. 2, NAND gate 501 outputs the ATTL OUT signal from level converter buffer 510 to the output ($\bar{A}$ 10) of bit buffer 201 via inverter 502. When the OTP2HVB signal is at the high voltage state (which means it is logically inactive), the output of NAND gate 501 is determined by its other input signal from the output ATTL OUT of level converter buffer 510. When OTP2HVB signal is at the low voltage state, the output of NAND gate 501 outputs a logical one signal, regardless of the ATTL OUT signal. At this point, the output of NAND gate 501 is set at logical one state by the logically active low OTP2HVB signal. The output A10 of bit buffer 201 is thus set to logical zero. The ATTL OUT signal applied at NAND gate 501 is then blocked by the OTP2HVB signal and no matter what happens to the ATTL OUT signal, the output of NAND gate 501 is set at logical one state as long as the OTP2HVB signal is logically active low.

By this arrangement, the output A10 of bit buffer 201 reflects the incoming signal INTTL10 when the OTP2HVB signal is at the high voltage state (inactive). When the OTP2HVB signal is logically active low, the output A10 of bit buffer 201 is determined by the active low OTP2HVB signal no matter what the ATTL OUT signal is.

The circuit formed by transistors 503, 504 and 505 is a latch circuit to latch the input ATTL OUT of NAND gate 501 when the OTP2HVB signal is at logical high state. This latch circuit of transistors 503, 504 and 505 holds the state of bit buffer 201 when an address latch enable signal ALE of Vcc voltage is applied to level converter buffer 510. The address latch enable signal ALE is a Vcc voltage or a zero voltage. Transistors 503 and 504 form a CMOS inverter that inverts the output of NAND gate 501 back to its input side ATTL OUT. Transistor 505 is in AND relation with the CMOS inverter formed by transistors 503 and 504. The $\bar{A}$ 10 output of bit buffer 201 is the inverted output of A10 output of bit buffer 201.

FIG. 6 shows circuit of level converter buffer 510 of FIG. 5. The input of level converter buffer 510 is the INTTL10 signal and its output is ATTL OUT. In FIG. 6, the INTTL10 signal is first applied to a CMOS inverter formed by a P channel transistor 601 and N channel 602. The output of transistors 601 and 602 at node 620 is connected to another CMOS inverter formed by a P channel transistor 603 and an N channel transistor 604. The output of the inverting transistors 603 and 604 is connected to the output ATTL OUT of level converter buffer 510. The purpose of transistor 605 is to ensure that the inverter formed by transistors 601 and 602 is at zero voltage when it outputs a logical zero signal and at Vcc voltage when it outputs a logical one signal. Similarly, transistor 611 ensures that the output ATTL OUT of level converter 510 is either at zero voltage when it outputs a logical zero signal or at Vcc voltage when it outputs a logical one signal.

During operation, when the input INTTL10 of level converter buffer 510 is applied as an input with a logical zero signal (which is 0.8 volts), the inverter of transistors 601 and 602 outputs a Vcc voltage at node 620 to the inverter of transistors 603 and 604, which in turn outputs a zero voltage at the output ATTL OUT. When the INTTL10 input is either a logical one voltage or the high voltage $V_h$, the inverter of transistors 601 and 602 outputs a zero voltage to the inverter of 603 and 604, which in turn outputs a Vcc voltage at the output ATTL OUT of level converter buffer 510.

Transistors 606 and 610 are always on. Transistors 607, 608, and 609 are gated by the ALE signal, which latches the INTTL10 signal when the ALE signal is at a Vcc voltage.

In the foregoing specification, the invention has been described with reference to specific embodiments thereof. It will, however, be evident that various modifications and changes made thereto without departing from the broader spirit and scope of the invention as set forth in the appended claims. The specification and drawings are, accordingly, to be regarded in an illustrative rather than a restrictive sense.

What is claimed is:

1. A memory device, comprising:
   (A) a memory array;
   (B) an address buffer for storing a plurality of bits of an address for addressing the memory array, wherein the address is applied as an input of the address buffer, wherein each bit of the address can be in a first voltage state, a second voltage state, and a third voltage state, wherein when at least one bit of the plurality of bits of the address is in the third voltage state, a test mode for the memory device is initiated;
   (C) circuitry for allowing the entire memory array to be addressed, wherein the circuitry converts any one bit of the address stored in the address buffer to the second voltage state if the one bit of the address is in the third voltage state, wherein the circuitry detects the state of two bits of the address and converts two corresponding address bits stored in the address buffer to the first voltage state if the two bits of the address are in the third voltage state, wherein the circuitry is coupled to the address buffer.

2. The memory device of claim 1, wherein the first voltage state is a logical low voltage, the second voltage state is a logical high voltage, and the third voltage state is an elevated high voltage.

3. The memory device of claim 2, wherein the elevated high voltage is approximately 12 volts.

4. The memory device of claim 1, wherein the two bits of the address are an A10 bit and an A13 bit.

5. The memory device of claim 1, wherein the circuitry for allowing the entire memory array to be addressed includes:
   (A) two high voltage detectors coupled to detect the third voltage state in the two bits of the address;
   (B) a converter coupled to the two high voltage detectors and the address buffer for converting the two address bits stored in the address buffer to the first voltage state; and
   (C) a level converter coupled to the address buffer for converting the third voltage state in the one bit of the address to the second voltage state.

6. A memory device, comprising:
   (A) a memory array;
   (B) an address buffer for storing a plurality of bits of an address for addressing the memory array, wherein the address is applied as an input of the address buffer, wherein each bit of the address can be in a first voltage state, a second voltage state, and a third voltage state;
   (C) a first circuit for detecting the state of any bit of the address and for triggering the test mode if the third voltage state is detected on at least one of the plurality of bits of the address; and
   (D) a second circuit for allowing the entire memory array to be addressed, wherein the second circuit detects the state of one bit of the address and converts one corresponding address bit stored in the address buffer to the second voltage state if the one bit of the address is in the third voltage state, wherein the second circuit detects the state of two bits of the address and converts two corresponding address bits stored in the address buffer to the first voltage state if the two bits of the address are in the third voltage state, wherein the second circuit is coupled to the address buffer.

7. The memory device of claim 6, wherein the first voltage state is a logical low voltage, the second voltage state is a logical high voltage, and the third voltage state is an elevated high voltage.

8. The memory device of claim 7, wherein the elevated high voltage is approximately 12 volts.

9. The memory device of claim 6, wherein the second circuit for allowing the entire memory array to be addressed includes:
   (A) two high voltage detectors coupled to detect the third voltage state in the two bits of the address;
   (B) a converter coupled to the two high voltage detectors and the address buffer for converting the two address bits stored in the address buffer to the first voltage state; and
   (C) a level converter coupled to the address buffer for converting the third voltage state in the one bit of the address to the second voltage state.

10. The memory device of claim 6, wherein the two bits of the address are an A10 bit and an A13 bit.

11. A method of triggering a test mode of a memory device comprising the steps of:
   (A) addressing a memory array of the memory device by applying an address of a plurality of bits to an address buffer, wherein the address is applied as an input of the address buffer, wherein each bit of the address can be in a first voltage state, a second voltage state, and a third voltage state, wherein when at least one bit of the address is in the third voltage state, the test mode for the memory device is initiated;
   (B) allowing the entire memory array to be addressed by detecting the state of two bits of the address and converting two corresponding address bits stored in the address buffer to the first voltage state if the two bits of the address are in the third voltage state, and by detecting the state of one bit of the address and converting one corresponding address bit stored in the address buffer to the second voltage state if the one bit of the address is in the third voltage state.

12. The method of claim 11, wherein the first voltage state is a logical low voltage, the second voltage state is a logical high voltage, and the third voltage state is an elevated high voltage.

13. The method of claim 12, wherein the elevated high voltage is approximately 12 volts.

14. The method of claim 11, wherein the two bits of the address are an A10 bit and an A13 bit.

15. A method of triggering a test mode of a memory device comprising the steps of:
   (A) addressing a memory array of the memory device by applying an address of a plurality of bits to an address buffer, wherein the address is applied as an input of the address buffer, wherein each bit of the address can be in a first voltage state, a second voltage state, and a third voltage state;

(B) detecting the state of any bit of the address and triggering the test mode if the third voltage state is detected on at least one of the plurality of bits of the address; and (C) allowing the entire memory array to be addressed by detecting the state of two bits of the address and converting two corresponding address bits stored in the address buffer to the first voltage state if the two bits of the address are in the third voltage state, and by detecting the state of one bit of the address and converting one corresponding address bit stored in the address buffer to the second voltage state if the one bit of the address is in the third voltage state.

16. The method of claim 15, wherein the first voltage state is a logical low voltage, the second voltage state is a logical high voltage, and the third voltage state is an elevated high voltage.

17. The method of claim 16, wherein the elevated high voltage is approximately 12 volts.

18. The method of claim 15, wherein the two bits of the address are an A10 bit and an A13 bit.

* * * * *